(12) United States Patent
Jovanovich et al.

(10) Patent No.: US 6,229,408 B1
(45) Date of Patent: May 8, 2001

(54) ZERO LOSS BIAS "T"

(75) Inventors: Alan F. Jovanovich, Des Moines; For Sander Lam, Seattle, both of WA (US)

(73) Assignee: Intermec IP Corp., Woodland Hills, CA (US)

( * ) Notice: Subject to any disclaimer, the term of this patent is extended or adjusted under 35 U.S.C. 154(b) by 0 days.

(21) Appl. No.: 09/314,645

(22) Filed: May 19, 1999

(51) Int. Cl.[7] ........................................... H03H 7/00
(52) U.S. Cl. ................................. 333/167; 333/175
(58) Field of Search ................................. 333/167, 175, 333/176

(56) References Cited

U.S. PATENT DOCUMENTS

| | | |
|---|---|---|
| 3,717,820 * | 2/1973 | Garcia et al. .......................... 330/305 |
| 4,698,605 | 10/1987 | Imamura et al. ...................... 333/189 |
| 5,105,172 | 4/1992 | Khatibzadeh et al. ............... 333/175 |
| 5,666,092 | 9/1997 | Yamamoto et al. .................. 333/194 |
| 5,838,215 | 11/1998 | Gu et al. ............................... 333/181 |

* cited by examiner

Primary Examiner—Justin P. Bettendorf
(74) Attorney, Agent, or Firm—O'Melveny & Meyers LLP

(57) ABSTRACT

A zero loss bias "T" is provided for use in an RF receiver front end in order to bias a received RF signal with a DC current. The zero loss bias "T" permits a DC current to be introduced into an RF signal path of a filter having filter characteristics sufficient to pass frequencies only in a desired passband without associated losses to the RF signal. The filter may be provided by an LC filter having a ground coupling point. DC current is coupled to the RF signal path of the filter via the ground coupling point.

14 Claims, 2 Drawing Sheets

ZERO LOSS BIAS "T"

BACKGROUND OF THE INVENTION

1. Field of the Invention

The present invention relates to RF receiver/transmitter systems, and more particularly to a zero loss bias "T" for use in a receiver front end.

2. Description of Related Art

The initial stage of a radio receiver/transmitter is referred to as the "front end," and serves to receive RF signals and down-convert them to intermediate frequency (IF) signals. The radio receiver/transmitter front end may include a bias "T", a bandpass filter, an amplifier, and a mixer. A received RF signal passes through the bias "T" to isolate it from a DC signal coupled from a DC power supply. The received signal is then provided to a bandpass filter that rejects adjacent extraneous frequencies outside the bandwidth of the received signal. The RF amplifier amplifies the received and filtered signal to a desired amplitude level. The mixer multiplies the amplified signal with a locally generated signal to produce an intermediate frequency (IF) or baseband received signal corresponding to a difference in frequency between the received signal and the locally generated signal. Thereafter, the IF or baseband received signal is provided to downstream demodulation stages that recover the information contained within the originally received signal.

More particularly, the bias "T" provides selective electrical isolation of a DC power supply node from RF signals present in the circuit and allows DC currents to flow with little or no restriction while impeding the flow of RF currents. A conventional bias "T" is disclosed in U.S. Pat. No. 5,105,172 to Khatibzadeh, et al. A bias "T" is generally used in RF designs to couple a DC voltage onto a line used for AC (RF) signals, or to detect/remove the DC component of a composite signal. For example, the bias "T" may be used to couple a switchable DC voltage out of an antenna port of a radio in order to accomplish both switched gain antenna selection and diversity antenna selection.

Many methods exist for coupling DC voltages onto AC signal lines. In its simplest form, a bias "T" may be provided by an inductive choke as disclosed in U.S. Pat. No. 5,838,215 to Gu, et al. For frequencies below 1 GHz, it is known to construct a bias "T" using discrete electrical components. Above 1 GHz, however, a bias "T" is usually constructed of tuned elements on a circuit board (such as in microstrip or stripline designs) and may or may not contain additional discrete passive components. A problem with the bias "T" designs used for high frequency applications is that they permit frequencies outside the desired band to pass. Another problem with these bias "T" designs is that they cause a loss of the desired AC signal.

Typical bandpass filters used in receiver front ends also cause a certain amount of loss to the AC signal. These filters are generally of the "monolithic" type and are provided from a component supplier as a single, non-tunable unit. Even though monolithic filters have an associated loss, the extent of the loss is likely to be less than a corresponding filter unit made from discrete components. Therefore, monolithic filters are desirable notwithstanding their associated signal loss. Multiple types of monolithic filters are commercially available. The most common ones are ceramic and surface acoustic wave (SAW) resonator filters as disclosed in U.S. Pat. No. 5,666,092 to Yamamoto, and inductance capacitance (LC) filters as disclosed in U.S. Pat. No. 4,698,605 to Imamura, et al.

Ceramic and SAW filters each use the same general principle. They are also known as "interdigital" filters and consist of several metallic fingers of carefully calculated geometry on a substrate. Energy at certain frequencies is resonated by respective ones of these fingers. The energy is transferred from finger to finger causing the desired frequencies to pass through the device, thereby providing a bandpass filter. A general characteristic of ceramic and SAW filters is that they do not include a DC path from input or output to ground. LC filters are combinations of inductors and capacitors that are made very small on a substrate and are combined in a single small package. Unlike ceramic and SAW filters, LC filters contain one or more inductors internally that do provide a DC path to ground from the input or output terminals.

In summary, the receiver front end circuits incur losses, which are extremely critical to receiver performance. The losses will directly subtract from the receiver's noise figure and hence the receiver's sensitivity and performance. Accordingly, the need exists for a method to minimize or eliminate the losses in standard bias applications while passing only frequencies in the desired passband.

SUMMARY OF THE INVENTION

In accordance with the teachings of the present application, a zero loss bias "T" is provided that eliminates losses incurred by traditional bias circuits while passing only frequencies in the desired passband.

The zero loss bias "T" comprises a filter having an RF conduction path for passing a band of frequencies. An input terminal for receiving a DC bias current is connected to a ground coupling point of the filter structure for integrating the DC bias current with the conduction path of the RF current. The DC bias current flows through an inductor, which provides a high impedance choke to the RF current. At least one capacitor is connected between ground and the ground coupling point of the filter circuit in order to provide an RF ground, thus allowing normal operation of the filter structure with radio frequencies. An LC filter having a DC path to ground is provided in order to be used as a filter structure of the zero loss bias "T" of the present invention.

A more complete understanding of the zero loss bias "T" will be afforded to those skilled in the art, as well as a realization of additional advantages and objects thereof, by a consideration of the following detailed description of the preferred embodiment. Reference will be made to the appended sheets of drawings, which will first be described briefly.

DETAILED DESCRIPTION OF THE PREFERRED EMBODIMENT

The present invention provides a bias "T" circuit that isolates received RF signals from DC bias signals, without the characteristic signal losses incurred by conventional bias "T" circuits. The bias "T" circuit of the present invention passes only frequencies within the desired passband of a received signal, thus improving the performance of RF receivers/transmitters. In the detailed description that follows, it should be appreciated that like element numerals are used to describe like elements illustrated in one or more of the figures.

Figure 1:
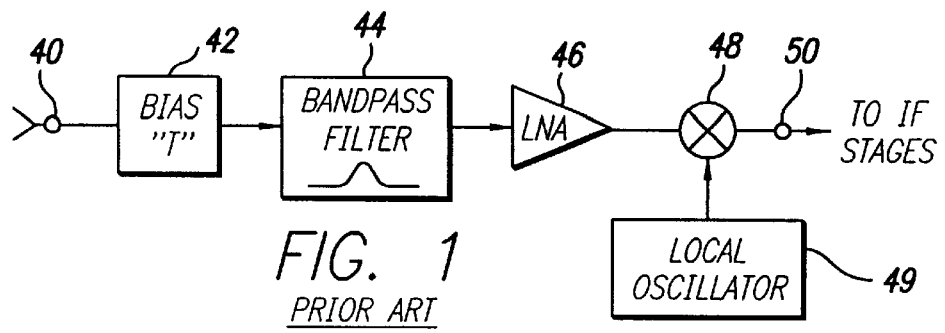
FIG. 1 is a block diagram of a front end of a prior art RF receiver.

Referring first to FIG. 1, a prior art receiver front end is shown. The receiver front end comprises a bias "T" 42, a bandpass filter 44, a low noise amplifier (LNA) 46, and a mixer 48 coupled to a local oscillator 49. An antenna connection or input terminal 40 is connected to one side of the bias "T" 42, the other side of which is connected to the bandpass filter 44, which passes a desired band of input frequencies and rejects adjacent extraneous frequencies outside the bandwidth of the received signal. As discussed above, typical bandpass filters used for microwave receiver front ends are of the "building block" or "monolithic" type. Receiver system developers typically obtain such monolithic filters from a component supplier in a single, complete, non-tunable unit. Although these monolithic-type filters have an associated loss, the loss is likely to be less than that of a unit made from discrete components. Multiple types of monolithic filters are commercially available, the most common being LC, ceramic, and SAW filters.

The bandpass filter 44 precedes the LNA 46, which amplifies the received and filtered RF signal to a desired amplitude level. The LNA 46 is in turn connected to an input of the mixer 48 that downconverts the incoming RF signal to an IF or baseband signal. The mixer 48 mixes the RF signal with an oscillating signal provided by a local oscillator 49 to produce difference signals having an IF frequency corresponding to the difference between the carrier frequency of the RF signal and the local oscillator signal. As known in the art, the incoming RF signal may be directly downconverted to IF or baseband by setting the oscillating signal from the local oscillator 49 to the carrier frequency of the RF signal. The other side of the mixer 48 is then connected to output node 50. Thereafter, the downconverted received signal is provided to downstream demodulation stages (not shown) that recover the information contained within the originally received signal. As discussed above, these elements of the receiver front end introduce signal losses that are extremely critical to receiver performance.

Figure 2:
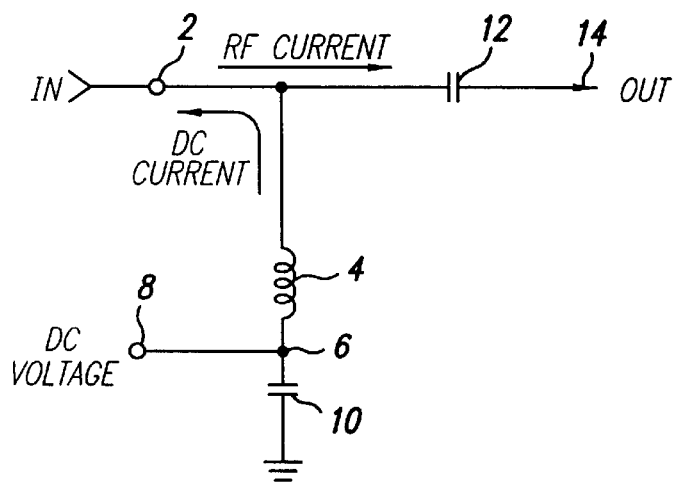
FIG. 2 is a schematic drawing of a prior art bias "T" circuit.

Referring next to FIG. 2, a prior art bias "T" circuit is shown in greater detail. The prior art bias "T" circuit includes an inductor 4 and capacitors 10 and 12. The capacitor 12 is provided in series to the RF current path between an RF input node 2 and RF output node14. The inductor 4 and capacitor 10 are provided in series together between the RF current path and ground. A DC voltage node 8 is defined between the inductor 4 and the capacitor 10, and DC current flows through inductor 4 to RF input node 2, wherein the DC current is used to bias either a passive or an active circuit (not shown). The DC current is prevented from flowing to the RF output node 14 by the capacitor 12 and from flowing to ground by the capacitor 10. The inductor 4 is a high impedance choke to the RF current. Therefore, the RF current flows freely from RF input node 2 to RF output node 14, and the inductor 4 prevents RF current from flowing to ground. The bias "T" is generally used to remove the DC component of a composite signal, or to couple a DC voltage onto a line used for RF signals.

Figure 3:
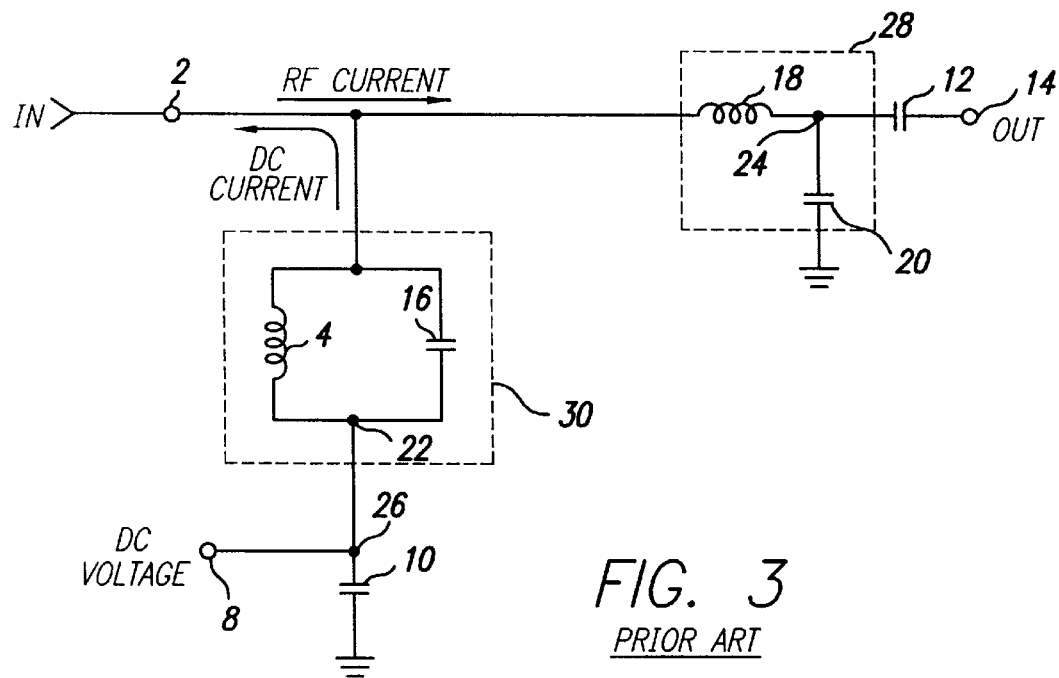
FIG. 3 is a schematic drawing of a prior art monolithic RF bias "T" circuit.

FIG. 3 shows a prior art monolithic bias "T" circuit. As in FIG. 2, an RF path is defined between an RF input terminal 2 and an RF output terminal 14. External RF signals are coupled to the RF input terminal 2, and DC current is also provided to the RF input terminal opposite to the direction of the RF current. An output matching network 28 is provided in the RF path, comprising an inductor 18 and a capacitor 20 coupled together at node 24. The capacitor 20 is connected between node 24 and ground. A blocking capacitor 12 is connected between the output matching network 28 and the RF output terminal 14. A monolithic RF choke 30 is provided between the RF path and ground. The RF choke 30 comprises an inductor 4 and a capacitor 16 provided in parallel. A DC input terminal 8 for receiving an external DC bias voltage is directly connected to a node 26. A bypass capacitor 10 is connected between the RF choke 30 and ground.

In operation, a DC voltage is applied to DC input terminal 8, which causes a DC current to flow through the inductor 4 of the RF choke 30 to the RF input terminal 2. The DC current is prevented from flowing to ground by capacitors 10 and 20, and is prevented from flowing to the RF output terminal 14 by capacitor 12, all of which appear as open circuits to the DC current. At the same time, the RF current flows into the bias "T" circuit through RF input terminal 2 through the matching network 28 and then through capacitor 12 to RF output terminal 14. The RF current is prevented from flowing into the RF choke 30 because the choke's resonant frequency is designed to be equal to the input circuit's operating frequency. At the resonant frequency, the RF choke 30 is an open circuit, hence no RF current flows into it. At the same time, however, it is a short circuit to the DC bias current flowing through inductor 4.

Figure 4:
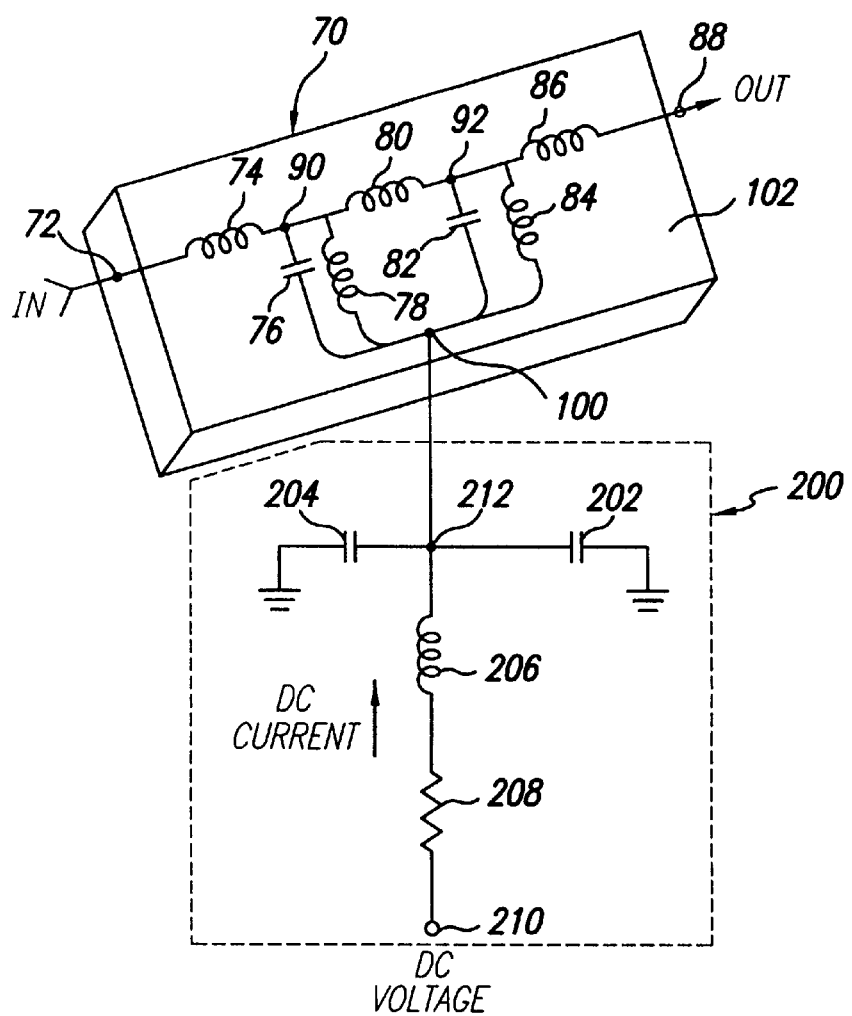
FIG. 4 is a schematic drawing of a zero-loss bias "T" according to an embodiment of the present invention.

Referring now to FIG. 4, a schematic drawing of a zero-loss bias "T" is shown according to an embodiment of the present invention, in which a DC bias circuit 200 is integrated with a monolithic LC filter 70 via a ground coupling point 100. The DC bias circuit 200 comprises a DC input terminal 210, a current limiting resistor 208, a choke inductor 206 and capacitors 202 and 204. The input terminal 210 is connected to one side of the current limiting resistor 208, the other side of which is connected in series to the choke inductor 206. The other end of the choke inductor 206 is connected to a node 212. Capacitors 202 and 204 are each connected between the node 212 and ground. The node 212 is coupled to the ground coupling point 100.

As known in the art, LC filters are available in many configurations from many manufacturers. LC filters typically contain one or more inductors (usually in the form of a tank circuit) that provide a DC path to ground from the input or output terminals. FIG. 4 shows a typical LC filter 70 as used in an embodiment of the present invention.

Particularly, the LC filter 70 of FIG. 4 comprises a substrate 102 onto which a plurality of discrete components are provided, including inductors 74, 78, 80, 84 and 86, and capacitors 76 and 82. An RF path is defined between an RF input terminal 72 and an RF output terminal 88. The inductors 74, 80, and 86 are coupled in series in the RF path between the RF input terminal 72 and the RF output terminal 88. Capacitor 76 and inductor 78 are coupled in parallel, and capacitor 82 and inductor 84 are coupled in parallel, with the two pairs of parallel elements coupled in series together and in parallel with inductor 80. The ground coupling point 100 is defined at the junction between the capacitor 76, the inductor 78, the capacitor 82, and the inductor 84.

The LC filter 70 permits certain frequencies to pass through it while attenuating other frequencies. In operation, DC current flows from the DC input terminal 210 through the choke inductor 206 and current limiting resistor 208 into the ground coupling point 100 of the monolithic LC filter 70. Thereafter, the DC current is coupled to the RF input and/or output terminals 72, 88. The capacitors 202 and 204 prevent DC current from flowing to ground, and provide a path to ground for the RF currents only. This "virtual," ground allows the LC filter 70 to operate in a normal manner by passing only desired frequencies of a signal. Thus, by integrating the DC bias circuit 200 and the monolithic LC filter 70 functions together, a DC current can be coupled onto an RF transmission line with little or no loss of the RF signal.

It should be noted that different circuit topographies, such as the ones described with respect to FIGS. 2 and 3, may alternatively be used in place of the DC bias circuit 200 illustrated in FIG. 4. The zero loss bias "T" of the present invention actually provides a performance increase over many standard bias "T" implementations because it will only pass frequencies outside the desired passband. Lastly, it should also be appreciated that other known types of filters can be utilized in place of the LC filter illustrated in FIG. 4.

Having thus described a preferred embodiment of a zero loss bias "T", it should be apparent to those skilled in the art that certain advantages of the within system have been achieved. It should also be appreciated that various modifications, adaptations, and alternative embodiments thereof may be made within the scope and spirit of the present invention. For example, a bias "T" using lumped inductance and capacitance components has been illustrated, but it should be apparent that the inventive concepts described above would be equally applicable to a bias "T" using high frequency tuned elements on a circuit board. The invention is further defined by the following claims.

What is claimed is:

1. A zero loss bias "T" circuit, comprising:
   means for filtering an RF signal to pass a desired band of frequencies therefrom, said filtering means having an internal RF conduction path and a ground coupling point connected thereto; and
   means for biasing said RF conduction path with a DC bias current, said biasing means being coupled to said RF conduction path via said ground coupling point, said RF signal being precluded from passing out of said ground coupling point thereby providing substantially zero loss of said RF signal.

2. The zero loss bias "T" of claim 1, wherein said filtering means further comprises a monolithic LC filter.

3. The zero loss bias "T" circuit of claim 1, wherein said biasing means further comprises an inductor and a DC current input terminal, said inductor being coupled between said ground coupling point and said DC current input terminal.

4. The zero loss bias "T" circuit of claim 1, wherein said filtering means further comprises a monolithic filter having a common substrate, said ground coupling point being defined on a portion of said substrate.

5. The zero loss bias "T" circuit of claim 1, further comprising at least one capacitor coupled between said ground coupling point and an electrical ground.

6. The zero loss bias "T" circuit of claim 1, wherein said filtering means further comprises an RF input terminal and an RF output terminal, said RF conduction path being defined therebetween.

7. A zero loss bias "T" circuit, comprising:
   means for filtering an RF signal to pass a desired band of frequencies therefrom, said filtering means having an RF conduction path and a ground coupling point: and
   means for biasing said RF conduction path with a DC bias current, said DC bias current being coupled to said RF conduction path via said ground coupling point, said RF signal being precluded from passing out of said ground coupling point thereby providing substantially zero loss of said RF signal, wherein said biasing means further comprises an inductor and a DC current input terminal, said inductor being coupled between said ground coupling point and said DC current input terminal, and wherein said biasing means further comprises a current limiting resistor coupled between said inductor and said DC current input terminal.

8. A zero loss bias "T" circuit, comprising:
   a filter having an RF input terminal and an RF output terminal with an RF conduction path defined therebetween, said filter further having a ground coupling point electrically connected to said RF conduction path;
   a DC current input terminal adapted to be coupled to a DC current source;
   an inductor coupled between said DC current input terminal and said ground coupling point; and
   at least one capacitor coupled between said ground coupling point and an electrical ground, wherein a DC current conducted onto said RF conduction path from said DC current input terminal is thereby provided without associated loss of an RF signal communicating on said RF conduction path.

9. The zero loss bias "T" circuit of claim 8, wherein said filter further comprises an LC filter.

10. The zero loss bias "T" circuit of claim 8, wherein said filter further comprises a monolithic filter having a common substrate, said ground coupling point being defined on a portion of said substrate.

11. An RF receiver front end circuit, comprising:
    a bias "T" having an RF input terminal adapted to receive an RF signal, an RF output terminal, and an integrated RF filter path disposed within said bias "T" between said input and output terminals, a DC current being provided on said RF filter path and accessible through one of said RF input terminal and said RF output terminal, said integrated RF filter path being adapted to pass a desired band of frequencies of said RF signal therethrough to provide a filtered RF signal at said RF output terminal;
    a low noise amplifier coupled to said RF output terminal, said low noise amplifier amplifying a voltage level of said filtered RF signal; and
    a mixer coupled to said low noise amplifier, said mixer mixing said amplified and filtered RF signal with a locally generated signal to provide an intermediate frequency signal;
    whereby, said RF receiver front end circuit utilizes said integrated RF filter path within said bias "T" instead of a separate RF bandpass filter stage and provides reduced RF signal loss as a result.

12. The RF receiver front end circuit of claim 11, wherein said bias "T" further comprises a ground coupling point electrically connected to said RF conduction path, an inductor coupled to said ground coupling point, and at least one capacitor coupled between said ground coupling point and an electrical ground, said DC current being coupled to said inductor.

13. The RF receiver front end circuit of claim 12, wherein said RF filter path further comprises a monolithic filter having a common substrate, said ground coupling point being defined on a portion of said substrate.

14. The RF receiver front end circuit of claim 11, wherein said RF filter path further comprises an LC filter.

* * * * *